United States Patent
Yang et al.

(10) Patent No.: US 12,191,269 B2
(45) Date of Patent: Jan. 7, 2025

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Yuancheng Yang, Wuhan (CN); Wenxi Zhou, Wuhan (CN); Zhiliang Xia, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 483 days.

(21) Appl. No.: 17/483,121

(22) Filed: Sep. 23, 2021

(65) Prior Publication Data

US 2023/0005864 A1 Jan. 5, 2023

Related U.S. Application Data

(63) Continuation of application No. PCT/CN2021/103427, filed on Jun. 30, 2021.

(51) Int. Cl.
*H01L 29/76* (2006.01)
*H01L 21/768* (2006.01)
(Continued)

(52) U.S. Cl.
CPC ........ *H01L 24/08* (2013.01); *H01L 21/76898* (2013.01); *H01L 23/481* (2013.01);
(Continued)

(58) Field of Classification Search
CPC . H01L 23/481; H01L 23/53228; H01L 24/80; H01L 25/18; H01L 2224/08145;
(Continued)

(56) References Cited

U.S. PATENT DOCUMENTS 10,115,681 B1 * 10/2018 Ariyoshi ................ H10B 43/10
10,199,326 B1 *  2/2019 Ohsaki .................. H10B 43/20
(Continued)

FOREIGN PATENT DOCUMENTS

CN      110140213 A      8/2019
CN      112614853 A      4/2021
(Continued)

OTHER PUBLICATIONS

International Search Report issued in corresponding International Application No. PCT/CN2021/103427, mailed Mar. 28, 2022, 4 pages.
(Continued)

*Primary Examiner* — Niki H Nguyen
(74) *Attorney, Agent, or Firm* — BAYES PLLC

(57) ABSTRACT

A three-dimensional (3D) memory device includes a first semiconductor structure and a second semiconductor structure. A first semiconductor structure includes a first substrate, and a memory array structure disposed on the first substrate. The second semiconductor structure is disposed over the first semiconductor structure, and the second semiconductor structure includes a second substrate, and a peripheral device in contact with the second substrate. The second substrate is formed between the peripheral device and the first semiconductor structure.

20 Claims, 18 Drawing Sheets

(51) Int. Cl.
*H01L 23/00* (2006.01)
*H01L 23/48* (2006.01)
*H01L 23/532* (2006.01)
*H01L 25/00* (2006.01)
*H01L 25/065* (2023.01)
*H01L 25/18* (2023.01)

(52) U.S. Cl.
CPC ........ *H01L 23/53228* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80031* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC . H01L 2224/80031; H01L 2224/80895; H01L 2224/80896; H01L 2924/1431; H01L 2924/14511; H01L 2924/00014; H01L 25/0657; H01L 2224/48227; H01L 2924/12042; H01L 24/48; H01L 2924/00012; H01L 2224/16225; H01L 25/50; H01L 24/05; H01L 2225/06541; H01L 2924/1305; H01L 2924/14; H01L 2225/06513; H01L 25/105; H01L 2924/12032; H01L 21/76254; H01L 2224/05573; H01L 2924/13062; H01L 2924/01033; H01L 2224/48145; H01L 2224/73253; H01L 2924/10253; H01L 2224/131; H01L 2924/01078; H01L 2224/16146; H01L 23/5252; H01L 2223/5442; H01L 2924/01006
See application file for complete search history.

(56) References Cited

U.S. PATENT DOCUMENTS

| | | | |
|---|---|---|---|
| 10,354,980 B1* | 7/2019 | Mushiga | H01L 21/76898 |
| 10,734,371 B2* | 8/2020 | Park | H01L 24/05 |
| 10,910,272 B1* | 2/2021 | Zhou | H10B 43/40 |
| 11,037,908 B2* | 6/2021 | Wu | H01L 25/50 |
| 11,127,728 B2* | 9/2021 | Zhou | H01L 24/14 |
| 2011/0118989 A1 | 5/2011 | Morinaga | |
| 2016/0343450 A1 | 11/2016 | Lee et al. | |
| 2017/0084696 A1 | 3/2017 | Lee et al. | |
| 2018/0277497 A1* | 9/2018 | Matsuo | H01L 25/0657 |
| 2019/0088676 A1* | 3/2019 | Tagami | H01L 23/5226 |
| 2020/0243500 A1* | 7/2020 | Zhou | G11C 16/08 |
| 2021/0005629 A1 | 1/2021 | Lim et al. | |
| 2021/0134819 A1* | 5/2021 | Zhang | H01L 23/481 |

FOREIGN PATENT DOCUMENTS

| | | |
|---|---|---|
| CN | 112909007 A | 6/2021 |
| WO | 2019182657 A1 | 9/2019 |

OTHER PUBLICATIONS

International Search Report issued in corresponding International Application No. PCT/CN2021/103413, mailed Mar. 28, 2022, 4 pages.

* cited by examiner

400

┌─────────────────────────────────────────────────────────────────────────┐
│ Bonding a composite substrate to the first dielectric layer, the composite substrate including │ ─── 402
│ a second dielectric layer, and the second dielectric layer is bonded to the first dielectric layer │
└─────────────────────────────────────────────────────────────────────────┘
                                        ↓
┌─────────────────────────────────────────────────────────────────────────┐
│ Removing a portion of the composite substrate to form a second doped semiconductor layer │
│ over the memory array structure, the second doped semiconductor layer including single │ ─── 404
│ crystalline silicon │
└─────────────────────────────────────────────────────────────────────────┘

FIG. 16

500

THREE-DIMENSIONAL MEMORY DEVICE AND METHOD FOR FORMING THE SAME

CROSS-REFERENCE TO RELATED APPLICATIONS

This application is a continuation of International Application No. PCT/CN2021/103427, filed on Jun. 30, 2021, entitled "THREE-DIMENSIONAL MEMORY DEVICE AND METHOD FOR FORMING THE SAME," which is hereby incorporated by reference in its entirety. This application is also related to U.S. application Ser. No. 17/483,176, filed on Sep. 23, 2021 even date, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

In one aspect, a 3D memory device is disclosed. The 3D memory device includes a first semiconductor structure, and a second semiconductor structure. The first semiconductor structure includes a first substrate, and a memory array structure disposed on the first substrate. The second semiconductor structure is disposed over the first semiconductor structure, and the second semiconductor structure includes a second substrate, and a peripheral device in contact with the second substrate. The second substrate is formed between the peripheral device and the first semiconductor structure.

In another aspect, a system is disclosed. The system includes a 3D memory device configured to store data and a memory controller. The 3D memory device includes a first semiconductor structure, and a second semiconductor structure. The first semiconductor structure includes a first substrate, and a memory array structure disposed on the first substrate. The second semiconductor structure is disposed over the first semiconductor structure, and the second semiconductor structure includes a second substrate, and a peripheral device in contact with the second substrate. The second substrate is formed between the peripheral device and the first semiconductor structure. The memory controller is coupled to the 3D memory device and is configured to control operations of the 3D memory device.

In still another aspect, a method for forming a 3D memory device is disclosed. A memory array structure is formed over a first substrate. A second substrate is formed over the memory array structure. A peripheral device is formed in contact with the second substrate. An interconnection layer is formed over the peripheral device. The second substrate is disposed between the peripheral device and the memory array structure.

In yet another aspect, a method for forming a 3D memory device is disclosed. A first dielectric layer is formed over a first substrate. A memory array structure is formed in the first dielectric layer. A second substrate is bonded to the first dielectric layer. The second substrate includes a second dielectric layer, and the second dielectric layer is bonded to the first dielectric layer. A heterogeneous interface is formed in the second substrate. A portion of the second substrate is removed along the heterogeneous interface to form a third substrate over the memory array structure. A peripheral device is formed in the third substrate. An interconnection layer over the peripheral device. The third substrate is disposed between the peripheral device and the memory array structure.

In yet another aspect, a method for forming a 3D memory device is disclosed. A first dielectric layer is formed over a first substrate. A memory array structure is formed in the first dielectric layer. A composite substrate is bonded to the first dielectric layer. The composite substrate includes a second dielectric layer, and the second dielectric layer is bonded to the first dielectric layer. A portion of the composite substrate is removed to form a second substrate over the memory array structure. A peripheral device is formed in the second substrate. An interconnection layer is formed over the peripheral device. The second substrate is disposed between the peripheral device and the memory array structure.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 16 illustrates a flowchart of a further exemplary method for forming a 3D memory device, according to some aspects of the present disclosure.

Figure 1:
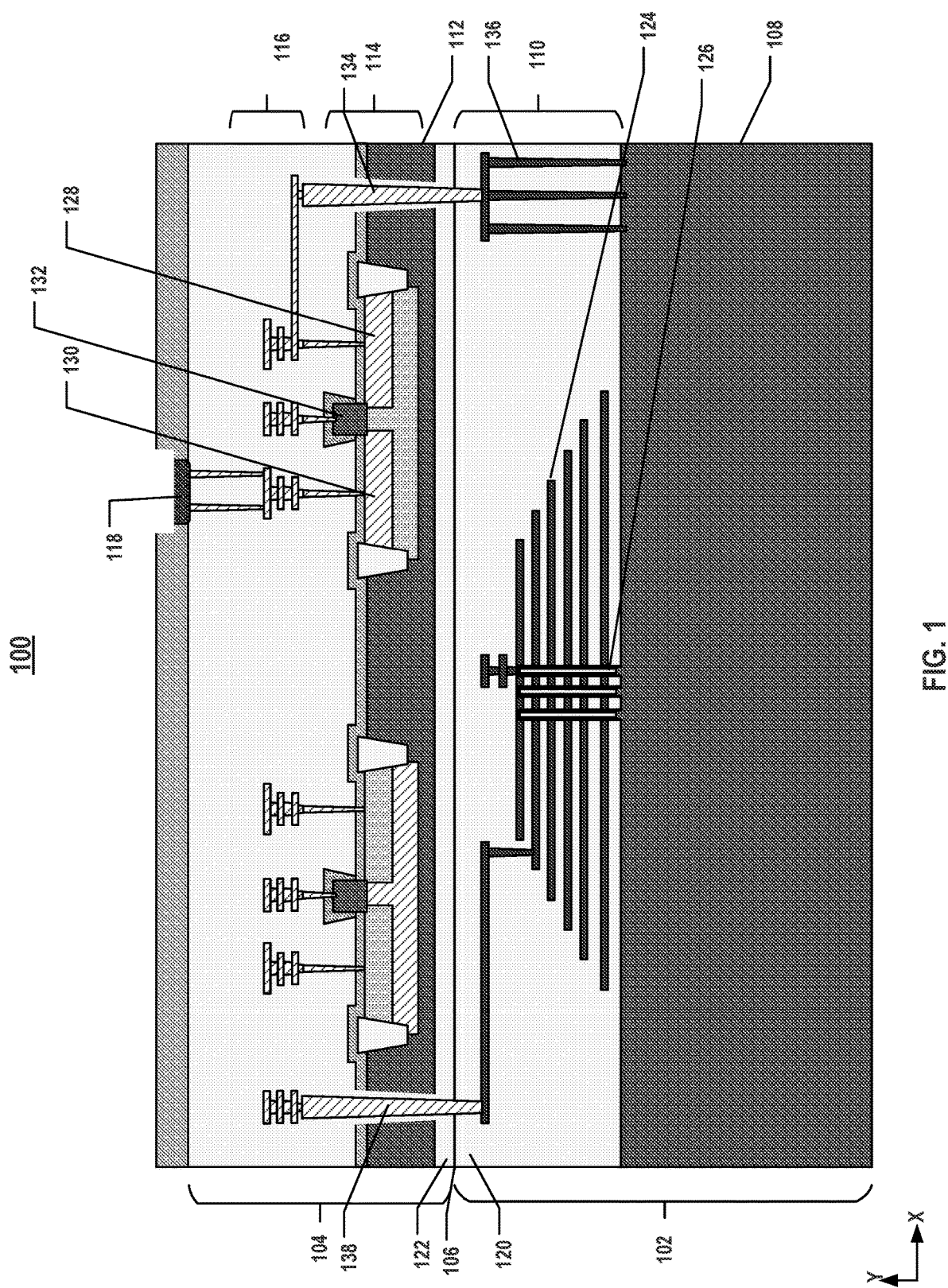
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of devices includes memory array devices and peripheral devices, such as complementary metal-oxide-semiconductor (CMOS) chips. As the number of layers in the array memory devices continues to increase, the sizes of either the memory array devices or the peripheral devices continue to decrease. Hence, the area of the CMOS chips needs to be reduced to ensure that the array efficiency will not be significantly reduced.

FIG. 1 illustrates a cross-section of an exemplary 3D memory device 100, according to some aspects of the present disclosure. 3D memory device 100 includes a first semiconductor structure 102 and a second semiconductor structure 104. A bonding interface 106 is formed between first semiconductor structure 102 and second semiconductor structure 104. First semiconductor structure 102 includes a substrate 108. Substrate 108 may be a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, first semiconductor structure 102 includes substrate 108, and substrate 108 includes doped single crystalline silicon layer.

In some implementations, substrate 108 is a thick substrate, as show in FIG. 1. In some implementations, when 3D memory device 100 needs to be padded out from substrate 108, substrate 108 may be a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. Substrate 108 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 108) in the y-direction (i.e., the vertical direction) when the substrate is positioned in the lowest plane of the 3D memory device in the y-direction. The same notion for describing spatial relationships is applied throughout the present disclosure.

In some implementations, 3D memory device 100 may be part of a non-monolithic 3D memory device, in which components (e.g., the peripheral device and memory array device) may be formed separately on different substrates and then bonded. In some implementations, a memory array structure 110 may be formed on substrate 108 to form first semiconductor structure 102. Then a substrate 112 is bonded on first semiconductor structure 102 and a peripheral device layer 114 is formed in substrate 112 to form second semiconductor structure 104. In some implementations, second semiconductor structure 104 may include substrate 112, and substrate 112 may include doped single crystalline silicon layer.

Bonding interface 106 is formed on the bonding surface between first semiconductor structure 102 and second semiconductor structure 104. In some implementations, second semiconductor structure 104 may further include an interconnection layer 116 formed on peripheral device layer 114 and electrically connected to peripheral device layer 114. 3D memory device 100 may further include a contact pad 118 disposed over second semiconductor structure 104. Contact pad 118 may be electrically coupled to peripheral device layer 114 through interconnection layer 116.

In some implementations, first semiconductor structure 102, including memory array structure 110, is formed first, and substrate 112 is then formed on memory array structure 110. In some implementations, for forming substrate 112 on memory array structure 110, a dielectric layer 120, e.g., silicon oxide, is formed on memory array structure 110, and another dielectric layer 122, e.g., silicon oxide, is further formed under substrate 112. Dielectric layer 120 and dielectric layer 122 are then bonded, and bonding interface 106 is formed on the bonding surface between dielectric layer 120 and dielectric layer 122.

In some implementations, 3D memory device 100 is a NAND Flash memory device in which memory cells are provided in the form of an array of NAND memory strings each extending vertically above substrate 108. As shown in FIG. 1, memory array structure 110 may include a memory stack 124 and channel structures 126. Memory stack 124 includes interleaved conductive layers and dielectric layers, and the conductive layers may include at least one source select gate line, a plurality of word lines, and at least one drain select gate line.

Channel structures 126 extend vertically through memory stack 124 in the y-direction. Channel structure 126 may include a channel hole filled with semiconductor materials (e.g., as a semiconductor channel) and dielectric materials (e.g., as a memory film). In some implementations, semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. In some implementations, the remaining space of channel structure may be partially or fully filled with a filling layer including dielectric materials, such as silicon oxide. Channel structure 126 may have a cylinder shape (e.g., a pillar shape). The filling layer, semiconductor channel, tunneling layer, storage layer, and blocking layer are arranged radially from the center toward the outer surface of the pillar in this order, according to some implementations. The tunneling layer may include silicon oxide, silicon oxynitride, or any combination thereof. The storage layer may include silicon nitride, silicon oxynitride, silicon, or any combination thereof. The blocking layer may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

In some implementations, peripheral device layer 114 may include one or more peripheral devices formed in substrate 112 and are configured to control and sense 3D memory device 100. The peripheral devices may include any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

In some implementations, peripheral device layer 114 includes a transistor having a first source/drain terminal 128, a second source/drain terminal 130, and a gate terminal 132. First source/drain terminal 128 may be electrically connected to substrate 108 through a through silicon contact (TSC) structure 134. In some implementations, first source/drain terminal 128 may be electrically connected to substrate 108 through TSC structure 134 and an interconnection structure 136. TSC structure 134 may be disposed between first semiconductor structure 102 and second semiconductor structure 104 penetrating substrate 112. Interconnection structure 136 may be formed in first semiconductor structure 102 connecting source terminals of the memory array as an array common source (ACS). In other words, the ACS of first semiconductor structure 102 is electrically connected to first source/drain terminal 128 of peripheral device layer 114 in second semiconductor structure 104.

In some implementations, contact pad 118 may be electrically connected to second source/drain terminal 130. In some implementations, another TSC structure 138 may be further formed between first semiconductor structure 102 and second semiconductor structure 104 penetrating substrate 112, and TSC structure 138 is electrically connected to at least one word line of memory stack 124.

Peripheral device layer 114 may include transistors formed on substrate 112, in which the entirety or part of the transistors are formed in substrate 112, e.g., entirely below or partially below the top surface of substrate 112. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral device layer 114 may further include any other circuits compatible with the advanced logic processes including logic circuits, such as processors and programmable logic devices (PLDs), or memory circuits, such as static random-access memory (SRAM) and dynamic RAM (DRAM).

In some implementations, second semiconductor structure 104 of 3D memory device 100 further includes interconnection layer 116 above peripheral device layer 114 to transfer electrical signals to and from peripheral device layer 114. Interconnection layer 116 may include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-ofline (BEOL) interconnects. The interconnect layer can further include one or more interlayer dielectric (ILD) layers (a.k.a. intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

In some implementations, peripheral device layer 114 is disposed between memory array structure 110 and contact pad 118, and the BEOL interconnects of the non-monolithic 3D memory device may be formed on contact pad 118. It is understood that in some implementations, 3D memory device 100, including first semiconductor structure 102 and second semiconductor structure 104, may be flipped over, and peripheral device layer 114 may be disposed beneath memory array structure 110. Under this situation, the BEOL interconnects of the non-monolithic 3D memory device may be formed beneath contact pad 118 under peripheral device layer 114.

FIGS. 2-13 illustrate cross-sections of 3D memory device 100 at different stages of a manufacturing process, according to some aspects of the present disclosure. FIG. 14 illustrates a flowchart of an exemplary method 200 for forming 3D memory device 100, according to some aspects of the present disclosure. For the purpose of better describing the present disclosure, the cross-sections of 3D memory device 100 in FIGS. 2-13 and method 200 in FIG. 14 will be discussed together. It is understood that the operations shown in method 200 are not exhaustive and that other operations may be performed as well before, after, or between any of the illustrated operations. Further, some of the operations may be performed simultaneously, or in a different order than shown in FIGS. 2-13 and FIG. 14.

Figure 2:
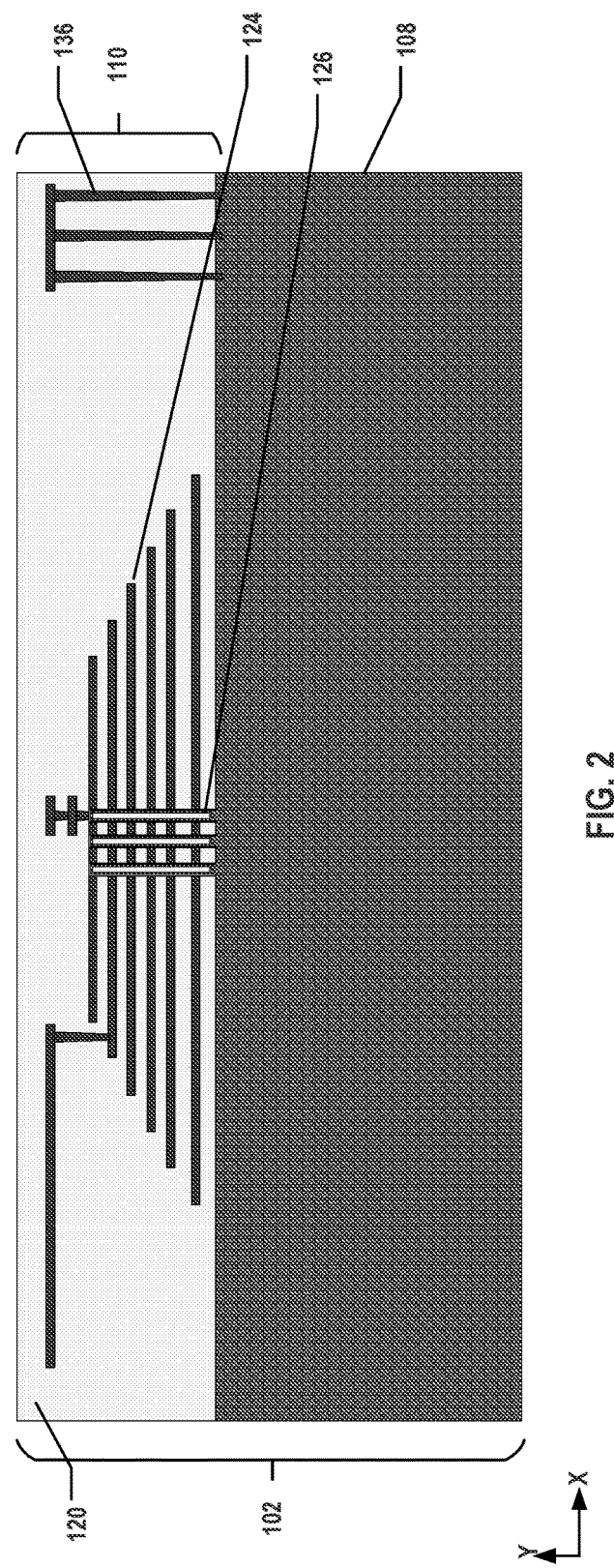
FIGS. 2-13 illustrate cross-sections of an exemplary 3D memory device at different stages of a manufacturing process, according to some aspects of the present disclosure.

As shown in FIG. 2 and operation 202 of FIG. 14, memory array structure 110 is formed on a first doped semiconductor layer, e.g., substrate 108, the first doped semiconductor layer comprising single crystalline silicon.

For forming memory array structure 110 on substrate 108, in some implementations, a dielectric stack including a plurality of dielectric layers and a plurality of sacrificial layers interleaved on substrate 108 is formed extending in the x-direction. Channel structure 126 is formed extending vertically through the dielectric stack in contact with substrate 108. Then, the plurality of sacrificial layers may be replaced with a plurality of conductive layers to form the word lines. In some implementations, each dielectric layer may include a layer of silicon oxide, and each sacrificial layer may include a layer of silicon nitride. The dielectric stack may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between substrate 108 and the dielectric stack by depositing dielectric materials, such as silicon oxide, on substrate 108.

Channel structure 126 is formed extending vertically through the dielectric stack in the y-direction. In some implementations, an etch process may be performed to form a channel hole in the dielectric stack that extends vertically through the interleaved dielectric/sacrificial layers. In some implementations, fabrication processes for forming the channel hole may include wet etching and/or dry etching, such as deep reactive ion etching (DRIE). In some implementations, the channel hole may extend further into the top portion of substrate 108. The etch process through the dielectric stack may not stop at the top surface of substrate 108 and may continue to etch part of substrate 108. After the formation of the channel hole, an epitaxial operation, e.g., a selective epitaxial growth operation, may be performed to form the channel contact on the bottom of the channel hole. Then, the memory film, including tunneling layer, storage layer, and blocking layer, and the semiconductor channel can be formed on the channel contact. In some implementations, channel structure 126 may not include the channel contact.

In some further implementations, for forming memory array structure 110 on substrate 108, a stack structure including a plurality of word lines is formed on substrate 108. Then, channel structure 126 is formed extending vertically through the stack structure in contact with substrate 108.

Figure 3:
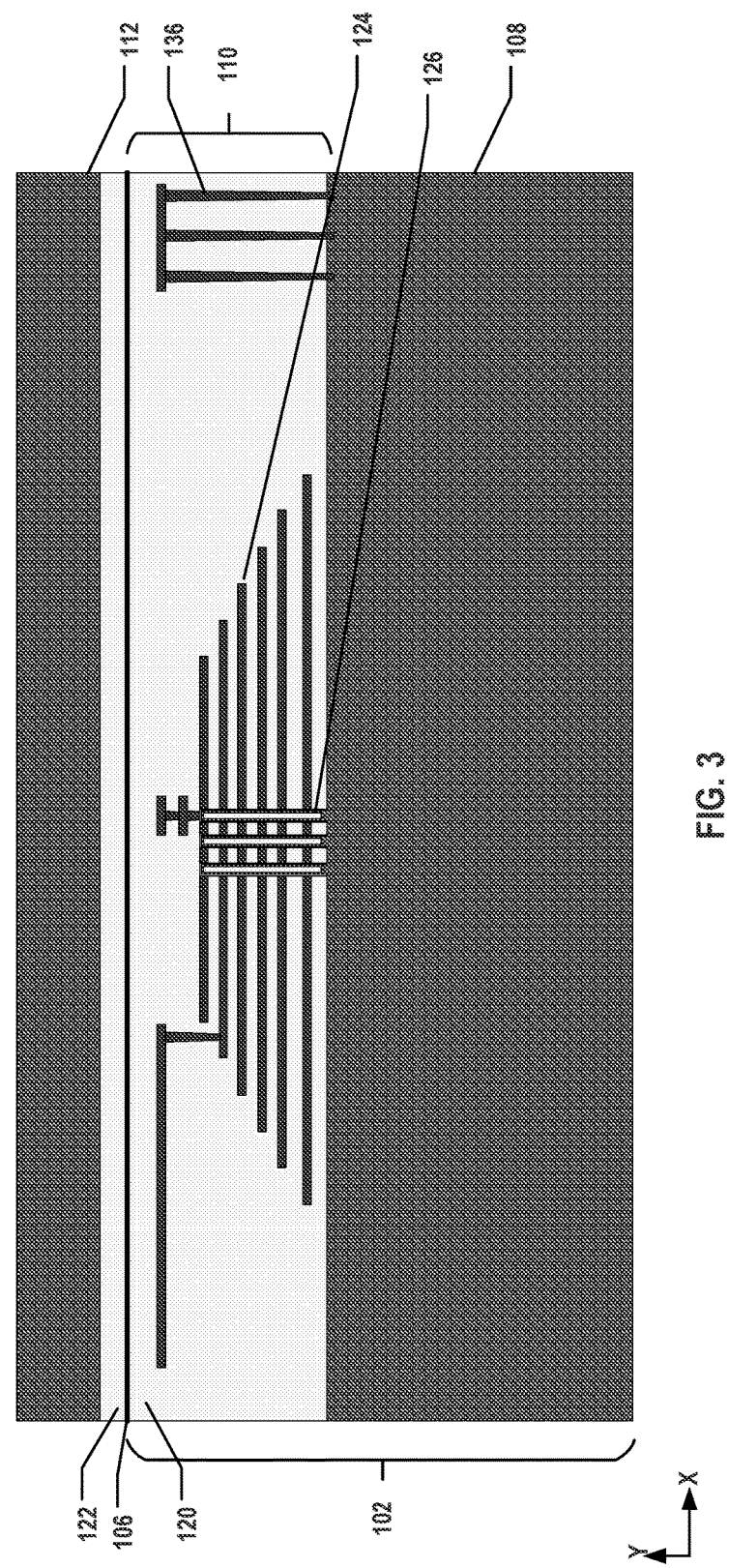

As shown in FIG. 3 and operation 204 of FIG. 14, a second doped semiconductor layer, e.g., substrate 112, is formed over memory array structure 110. The second doped semiconductor layer includes single crystalline silicon. First semiconductor structure 102 includes dielectric layer 120 formed on memory array structure 110, and dielectric layer 120 is bonded to dielectric layer 122. Bonding interface 106 is formed on the bonding surface between dielectric layer 120 and dielectric layer 122, as shown in FIG. 3.

Figure 15:
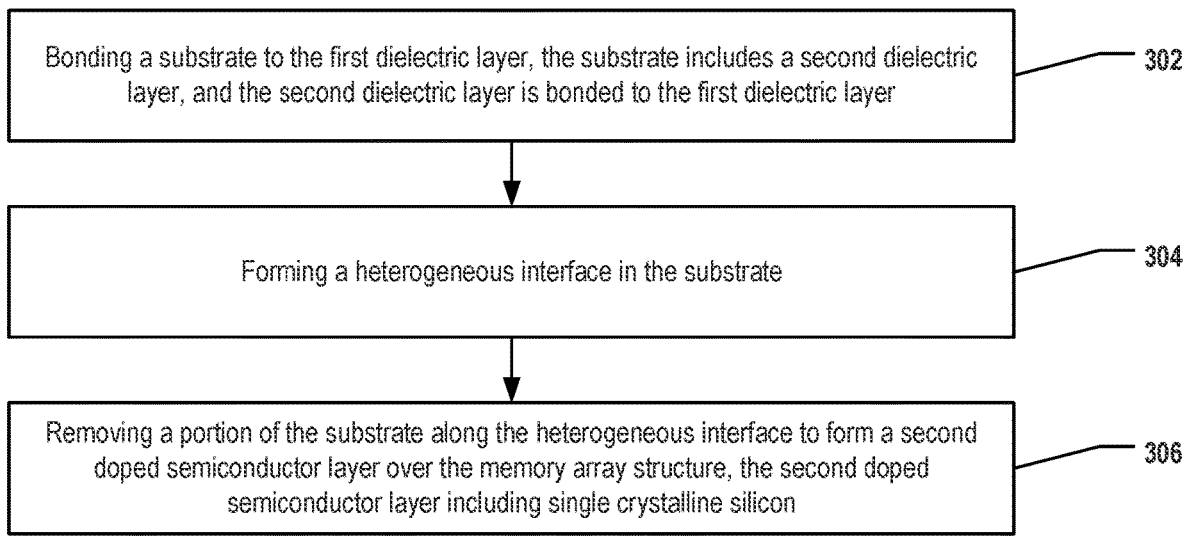
FIG. 15 illustrates a flowchart of another exemplary method for forming a 3D memory device, according to some aspects of the present disclosure.

In some implementations, bonding substrate 112 on dielectric layer 120 may include a series of operations shown in FIGS. 4-7. In FIGS. 4-7, a single crystalline silicon layer (substrate 112) is transferred from a substrate 140 (a "donor substrate") onto dielectric layer 120, for example, using a de-bonding process. FIG. 15 is a flowchart of an exemplary method 300 for transferring a single crystalline silicon layer, according to some aspects of the present disclosure.

Figure 4:
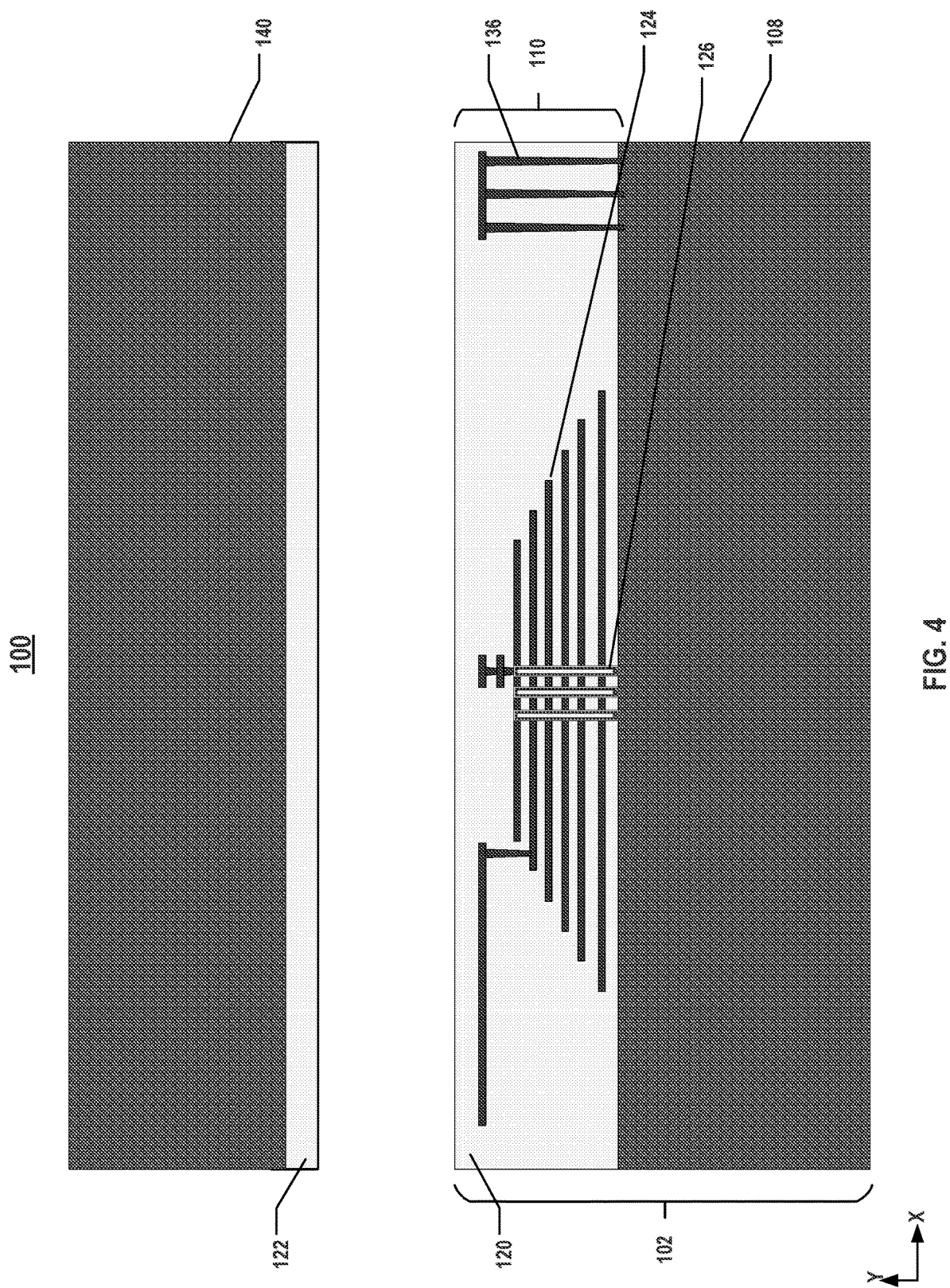
Figure 5:
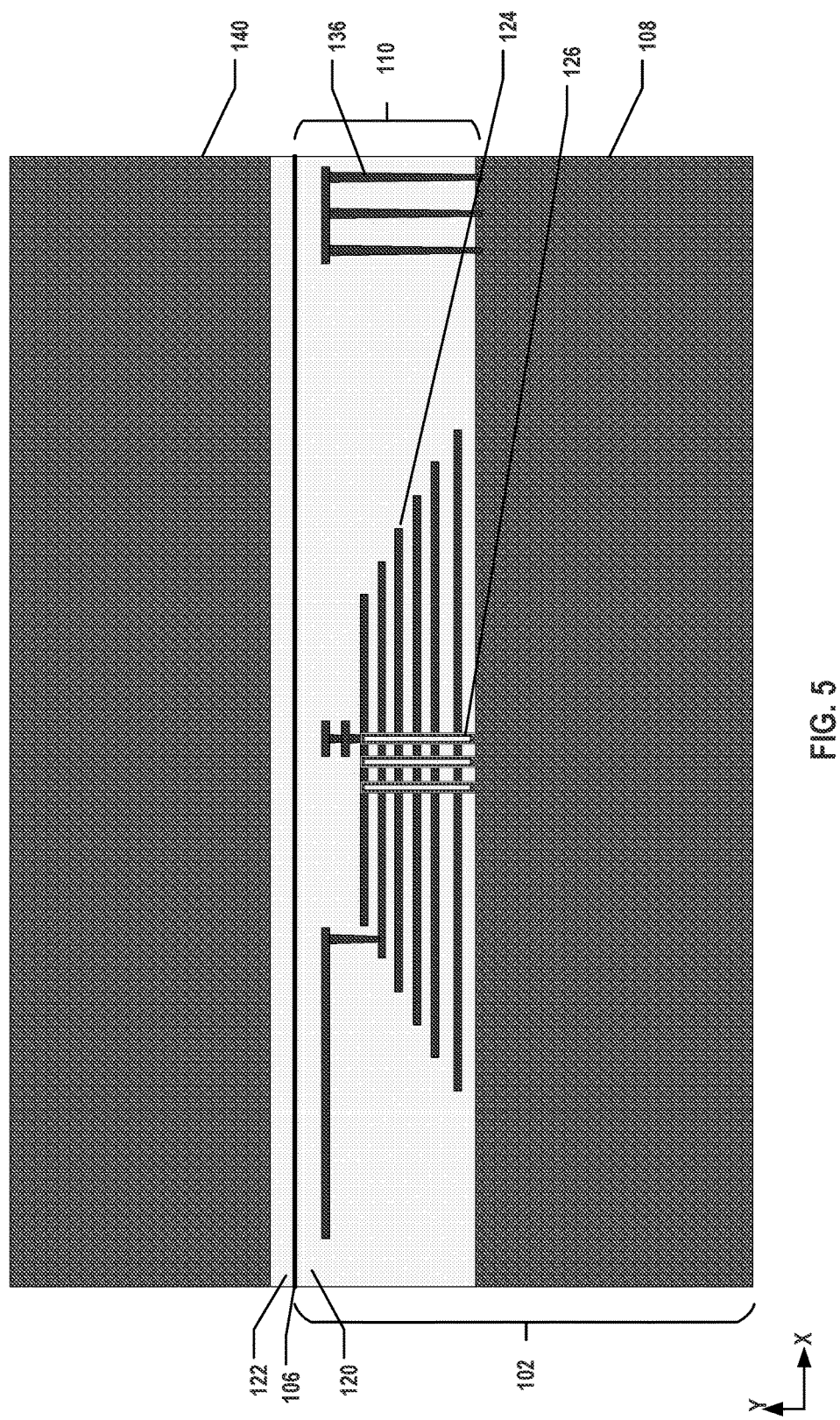

As shown in FIG. 4 and operation 302 in FIG. 15, substrate 140 including dielectric layer 122 is provided, and then substrate 140 is bonded onto memory array structure 110, as shown in FIG. 5. Substrate 140 includes a single crystalline silicon layer. Bonding interface 106 is formed on the bonding surface between dielectric layer 120 and dielectric layer 122.

Figure 6:
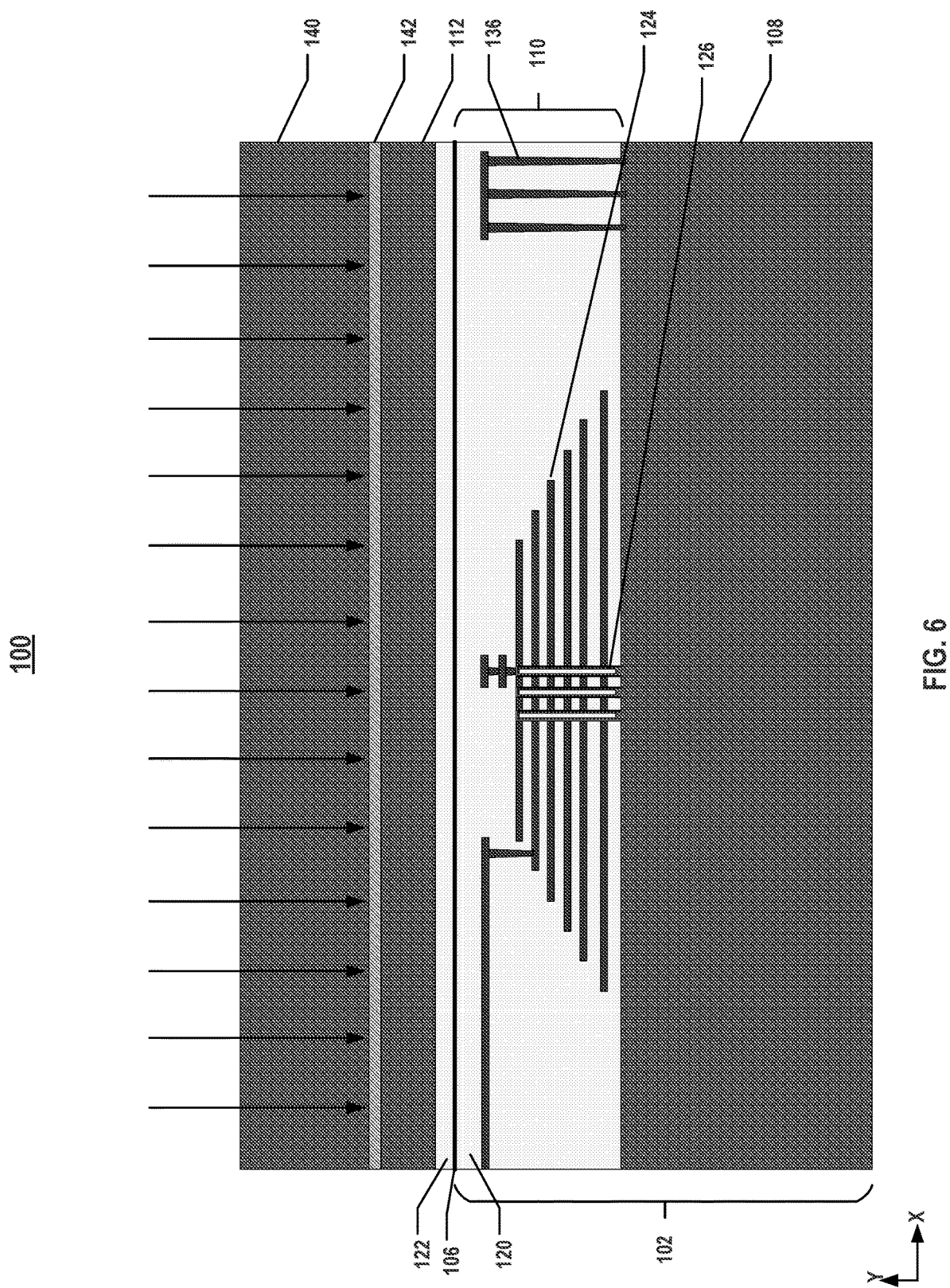

As shown in FIG. 6 and operation 304 in FIG. 15, a heterogeneous interface 142 is formed in substrate 140. In some implementations, an ion implantation process is performed into substrate 140 to form heterogeneous interface 142 in substrate 140, which separates a doped single crystalline silicon layer (substrate 112) from the remainder of substrate 140. In some embodiments, the dopant is hydrogen, including hydrogen ions and/or hydrogen atoms. It is understood that any other suitable dopants that can form heterogeneous interface 142 in substrate 140 may be used as well. For example, light-ion implantation may be used to implant light ions, such as protons or helium ions, into substrate 112, which can be later removed from substrate 112. The thickness of substrate 112, i.e., the distance between heterogeneous interface 142 and bonding interface 106 in the y-direction can be controlled by various parameters of the ion implantation, such as energy, dopant, dose, time, etc., as well as parameters of post-annealing, such as temperature and time of thermal diffusion following the ion implantation. In some embodiments, the thickness of substrate 112 is between about 1 µm and about 100 µm, such as between 1 µm and 100 µm (e.g., 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, any range bounded by the lower end by any of these values, or any range defined by any two of these values). Thickness uniformity can be controlled by fine-tuning control of the implanted dopants over the entire surface of substrate 140.

Heterogeneous interface 142 is an interface in substrate 140 between two layers with different materials, such as hydrogen-implanted single crystalline silicon and undoped single crystalline silicon as shown in FIG. 6. The existence of heterogeneous interface 142 in substrate 140 can facilitate the separation of the two material layers, such as substrate 112 and the remainder of substrate 140, later in the de-bonding process.

Figure 7:
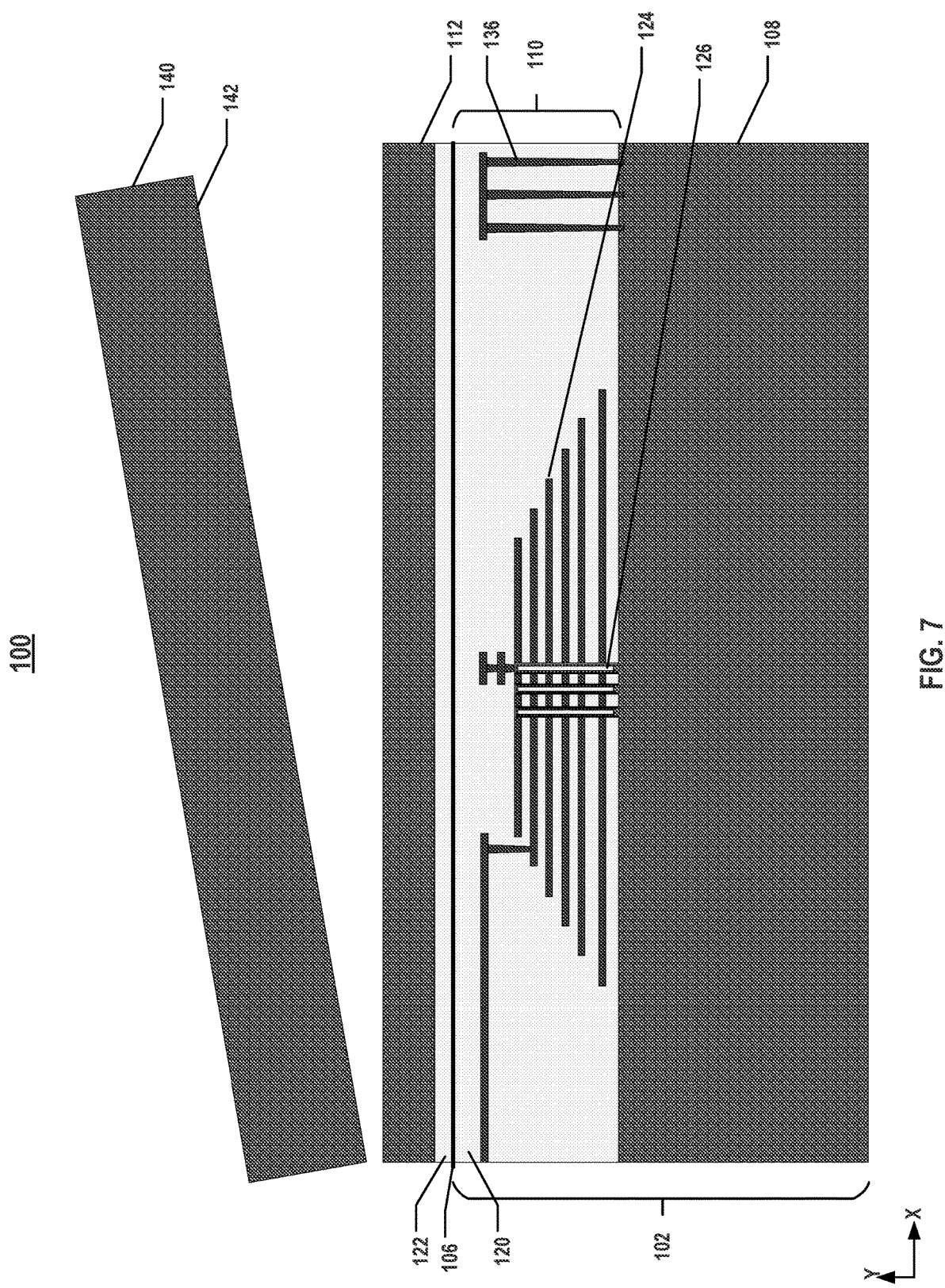

As shown in FIG. 7 and operation 306 in FIG. 15, the remainder of substrate 140 is removed from substrate 112 along heterogeneous interface 142. Substrate 112 is then formed over memory array structure 110, and substrate 112 is doped single crystalline silicon, as shown in FIG. 3. The remainder of substrate 140 is split from substrate 112 along heterogeneous interface 142 in substrate 140 to leave substrate 112. Substrate 112 remains bonded on memory array structure 110.

As illustrated in FIG. 7, substrate 140 is split from substrate 112 along heterogeneous interface 142 by applying a mechanical force on substrate 140, for example, because the bonding strength at bonding interface 106 is greater than the breaking force at heterogeneous interface 142. In other words, substrate 140 can be broken and peeled off from substrate 112 along heterogeneous interface 142. As a result, substrate 112 can be transferred from its donor substrate, substrate 140, to memory array structure 110 using the de-bonding process described above. In some implementations, after splitting substrate 140 from substrate 112, a planarization operation, e.g., CMP process, may be further performed on the surface of substrate 112 to smooth the surface of substrate 112.

Figure 8:
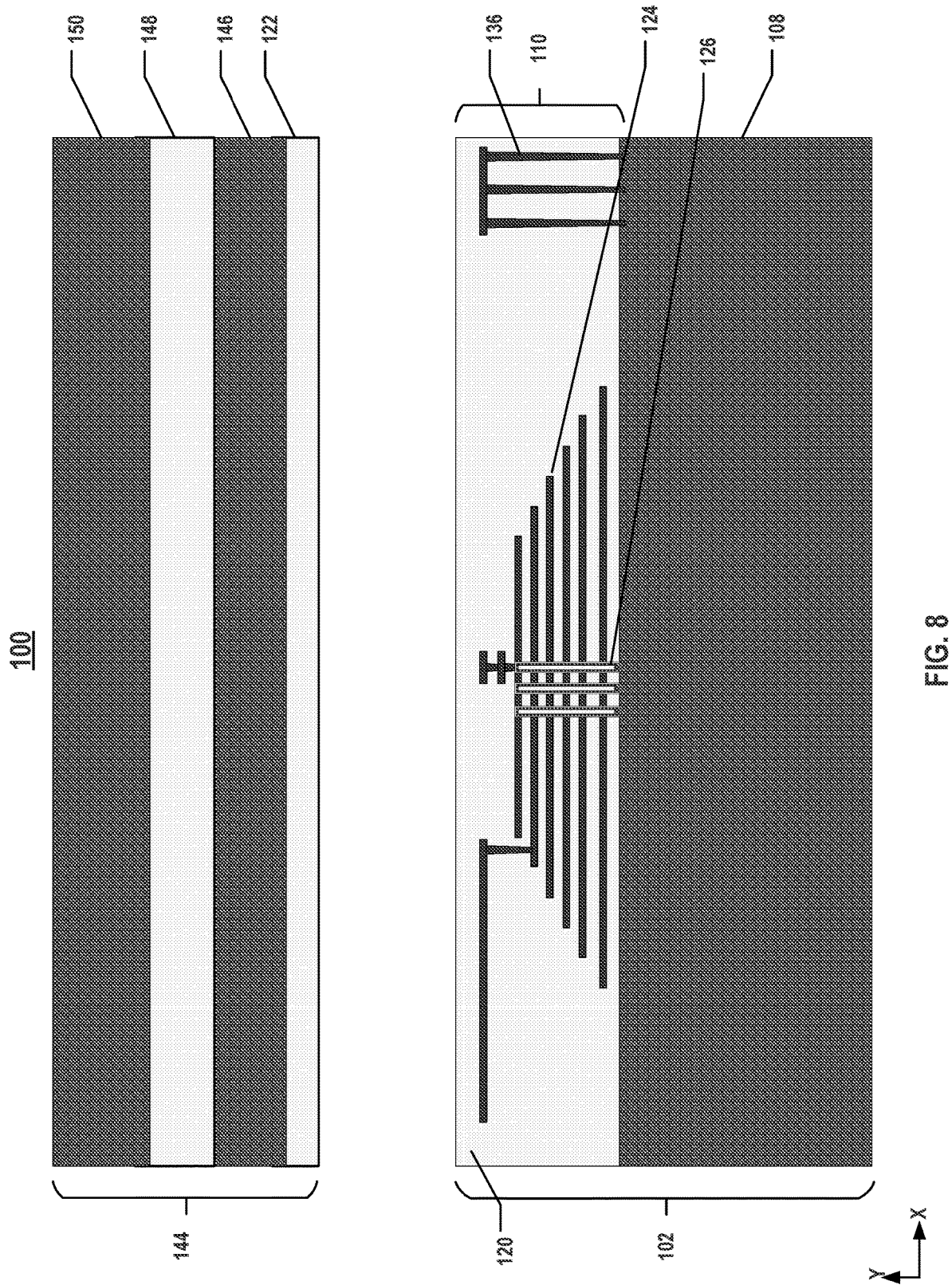
Figure 9:
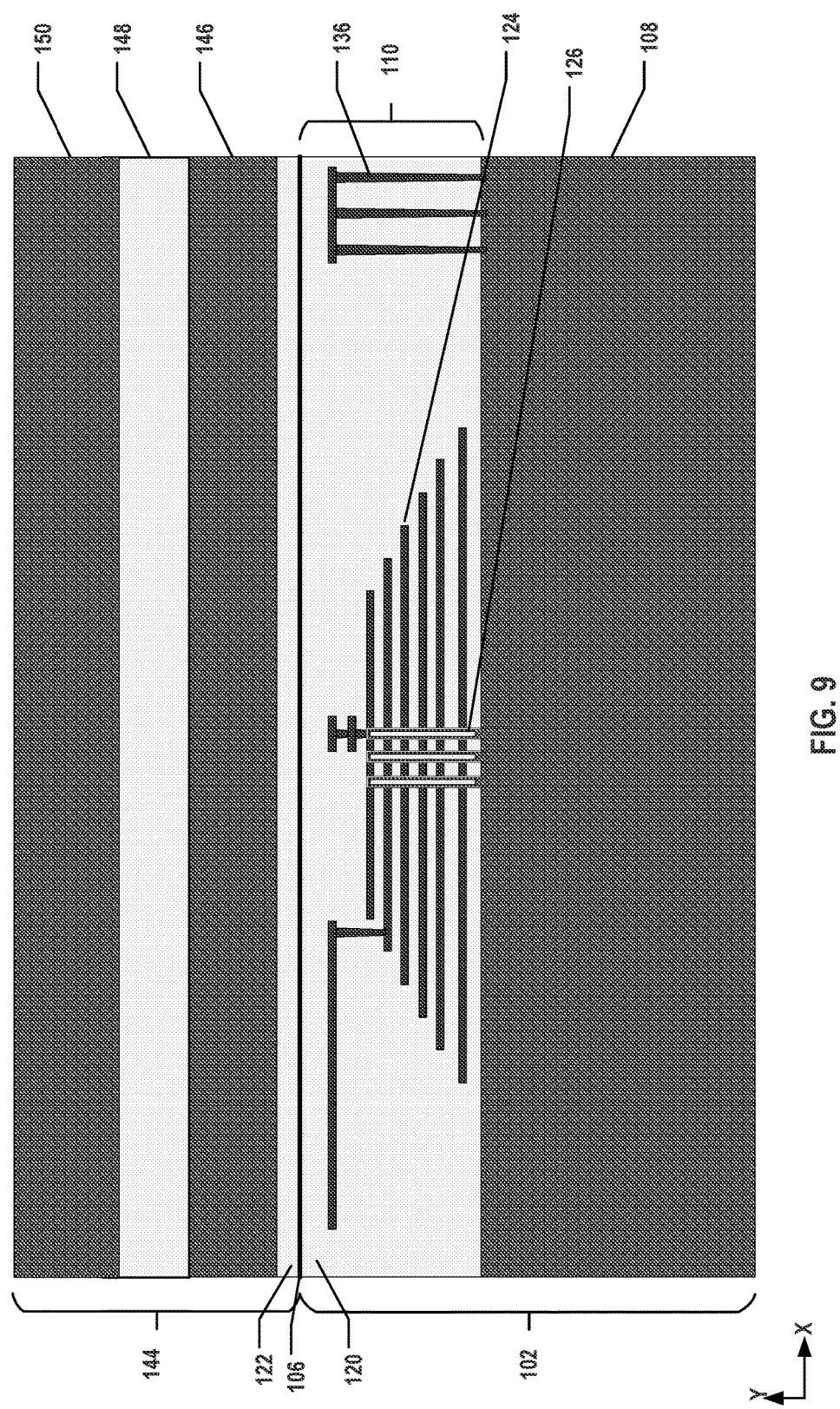
Figure 10:
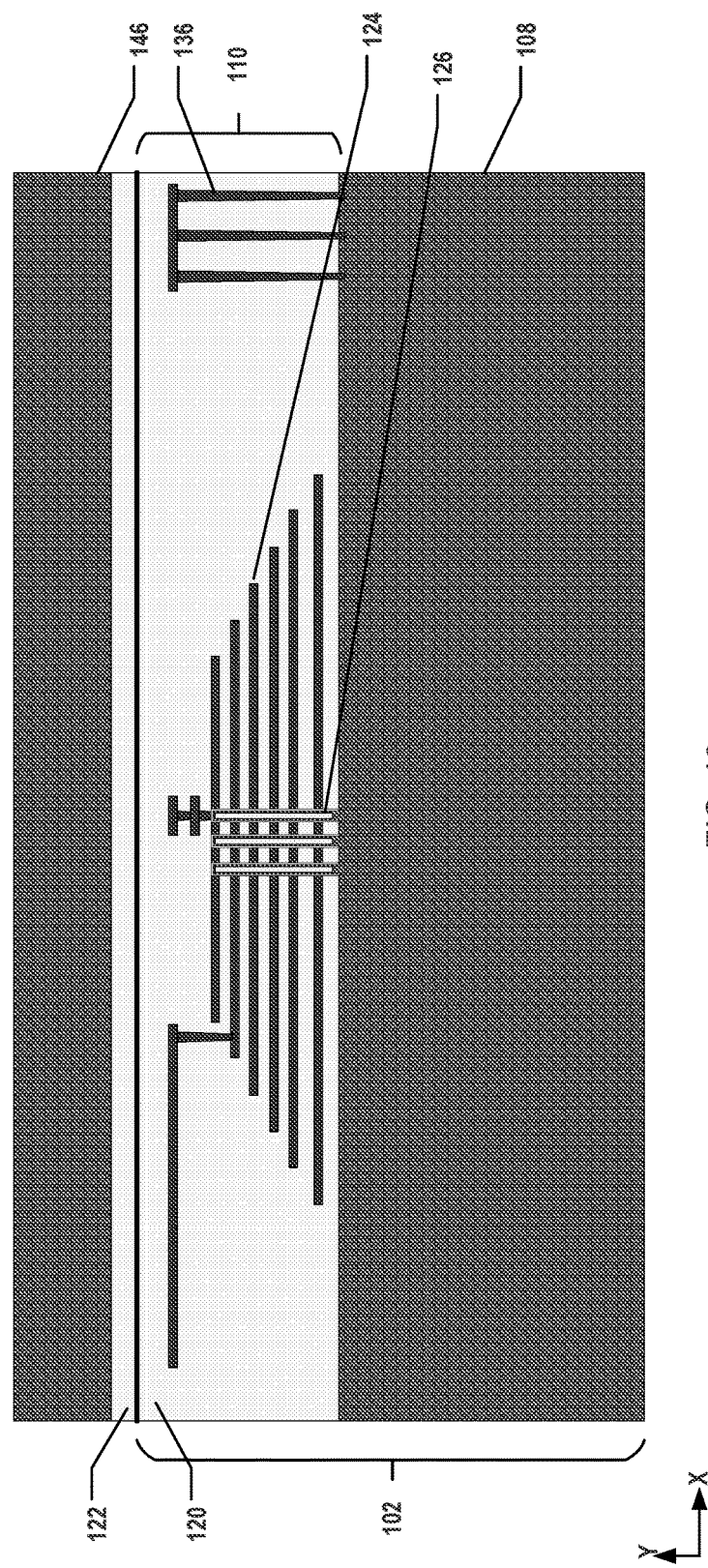

In some implementations, bonding substrate 112 on dielectric layer 120 may include another series of operations shown in FIGS. 8-10. In FIGS. 8-10, a single crystalline silicon layer (substrate 112) is transferred from a composite substrate 144 onto dielectric layer 120. FIG. 16 is a flowchart of an exemplary method 400 for transferring a single crystalline silicon layer, according to some aspects of the present disclosure.

As shown in FIG. 8 and operation 402 in FIG. 16, composite substrate 144 is provided, and then composite substrate 144 is bonded on memory array structure 110, as shown in FIG. 9. Composite substrate 144 may include dielectric layer 122, a single crystalline silicon layer 146, an insulation layer 148, and a sacrifice layer 150 on the top. In some implementations, composite substrate 144 may be manufactured independently from a semiconductor substrate as a silicon wafer, e.g., silicon-on-insulator (SOI) wafer. For example, a wafer made of single crystalline silicon may first be provided by cutting from a large cylindrical ingot of silicon. Then high energy ion implantation may be carried out on the wafer so that an oxygen-rich layer may be formed within the wafer, which is subsequently oxidized to form insulation layer 148 (e.g., silicon oxide layer). In some implementations, oxygen is implanted into the single crystalline silicon wafer and converted into a silicon dioxide buried layer (insulation layer 148). Dielectric layer 122 (e.g., silicon oxide layer) may be further formed on single crystalline silicon layer 146. Composite substrate 144 including heterogeneous materials (e.g., single crystalline silicon, silicon oxide, etc.) is thus obtained.

Composite substrate 144 is bonded to first semiconductor structure 102 in a face-to-face manner, in which dielectric layer 120 and dielectric layer 122 are bonded together, and bonding interface 106 is formed on the bonding surface between dielectric layer 120 and dielectric layer 122.

As shown in FIG. 10 and operation 404 in FIG. 16, a portion of composite substrate 144 is removed to form the doped semiconductor layer (substrate 112). In some implementations, a portion of composite substrate 144 that includes sacrifice layer 150 and insulation layer 148 may be subsequently broken and peeled off from the rest of composite substrate 144 in a de-bonding process along a heterogeneous interface that separates the layers of heterogeneous materials, e.g., the interface between insulation layer 148 and single crystalline silicon layer 146. Thus, only single crystalline silicon layer 146 is left on top of dielectric layers 122 and 120. The remainder of single crystalline silicon layer 146 forms substrate 112, and substrate 112 is doped single crystalline silicon, as shown in FIG. 3.

Figure 11:
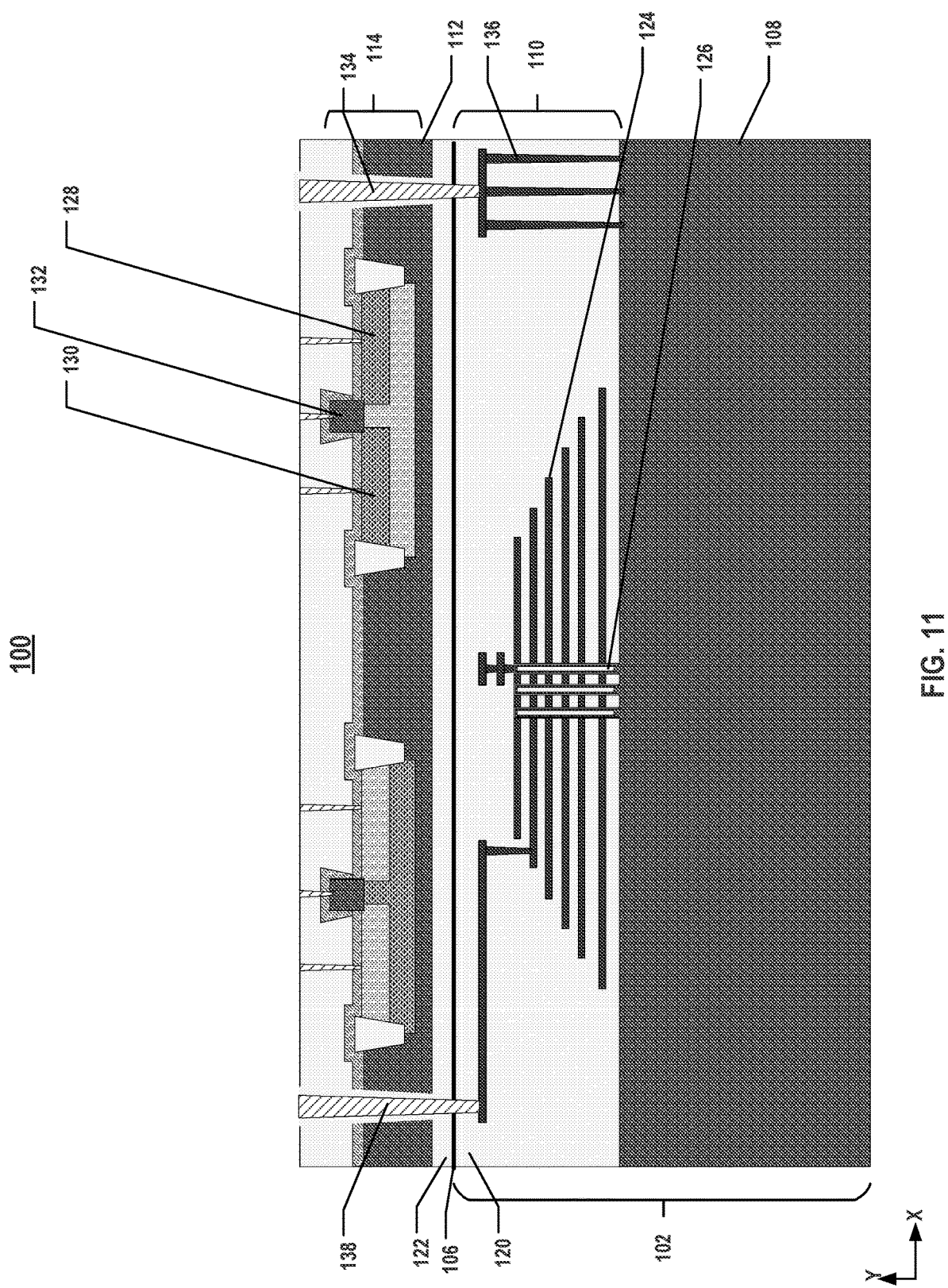

As shown in FIG. 11 and operation 206 in FIG. 14, peripheral device layer 114 is formed in substrate 112. Peripheral device layer 114 may include a plurality of peripheral circuits that are electrically connected to memory array structure 110 through the later formed interconnection layer 116. In some implementations, peripheral device layer 114 may include a plurality of transistors, as shown in FIG. 11. Each transistor may include first source/drain terminal 128, second source/drain terminal 130, and gate terminal 132 formed in substrate 112 as doped regions. In some implementations, isolation regions (e.g., STIs) are also formed in substrate 112 by wet etching and/or dry etching and thin film deposition. The transistors can form peripheral circuits in peripheral device layer 114. In some implementations, two transistors having different doping types may form a CMOS structure, as shown in FIG. 11.

In some implementations, TSC structures 134 and 138 may also be formed in substrate 112 and penetrate through substrate 112 to first semiconductor structure 102. TSC structures 134 and 138 may provide electrical connection between components of heterogenous materials, such as combining peripheral circuits with memory cells. In some implementations, TSC structures 134 and 138 may include conductive materials including, but not limited to, tungsten (W), cobalt (Co), copper (Cu), aluminum (Al), silicides, or any combination thereof.

Figure 12:
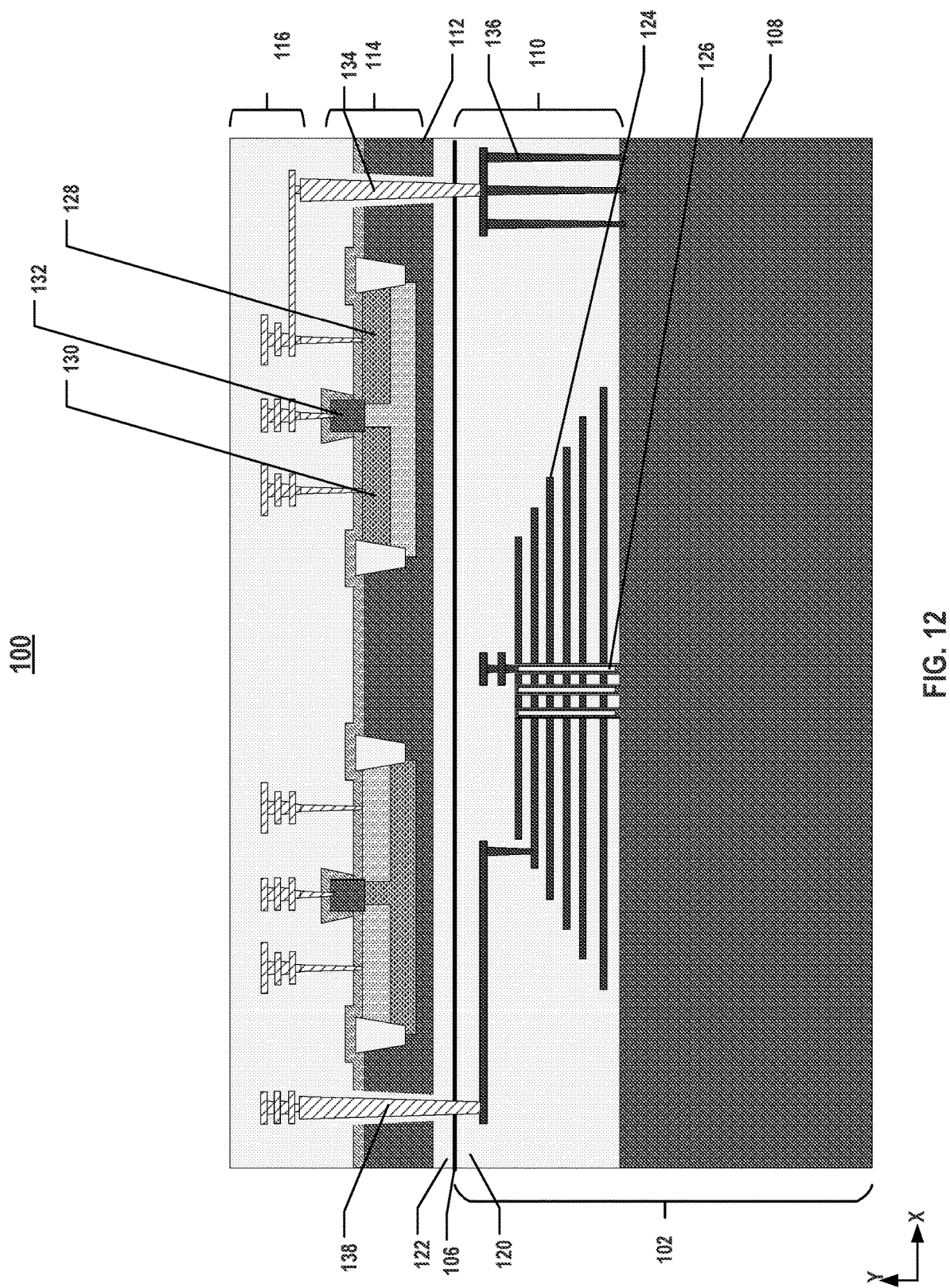

As shown in FIG. 12 and operation 208 in FIG. 14, interconnection layer 116 is formed on peripheral device layer 114. Interconnection layer 116 may be above and electrically connect second source/drain terminal 130 for pad-out, e.g., transferring electrical signals between 3D memory device 100 and external circuits. Interconnection layer 116 may further electrically connect first source/drain terminal 128 and TSC structure 134. In some implementations, interconnection layer 116 may further connect a plurality of peripheral devices in 3D memory device 100. In some implementations, interconnection layer 116 may include one or more interlayer dielectric (ILD) layers and one or more redistribution layers disposed in the ILD layers to electrically connect devices. The ILD layers may include dielectric materials including, but not limited to, silicon oxide, silicon nitride, silicon oxynitride, low-k dielectrics, or any combination thereof. The redistribution layer may include conductive materials including, but not limited to, W, Co, Cu, Al, silicides, or any combination thereof.

Figure 13:
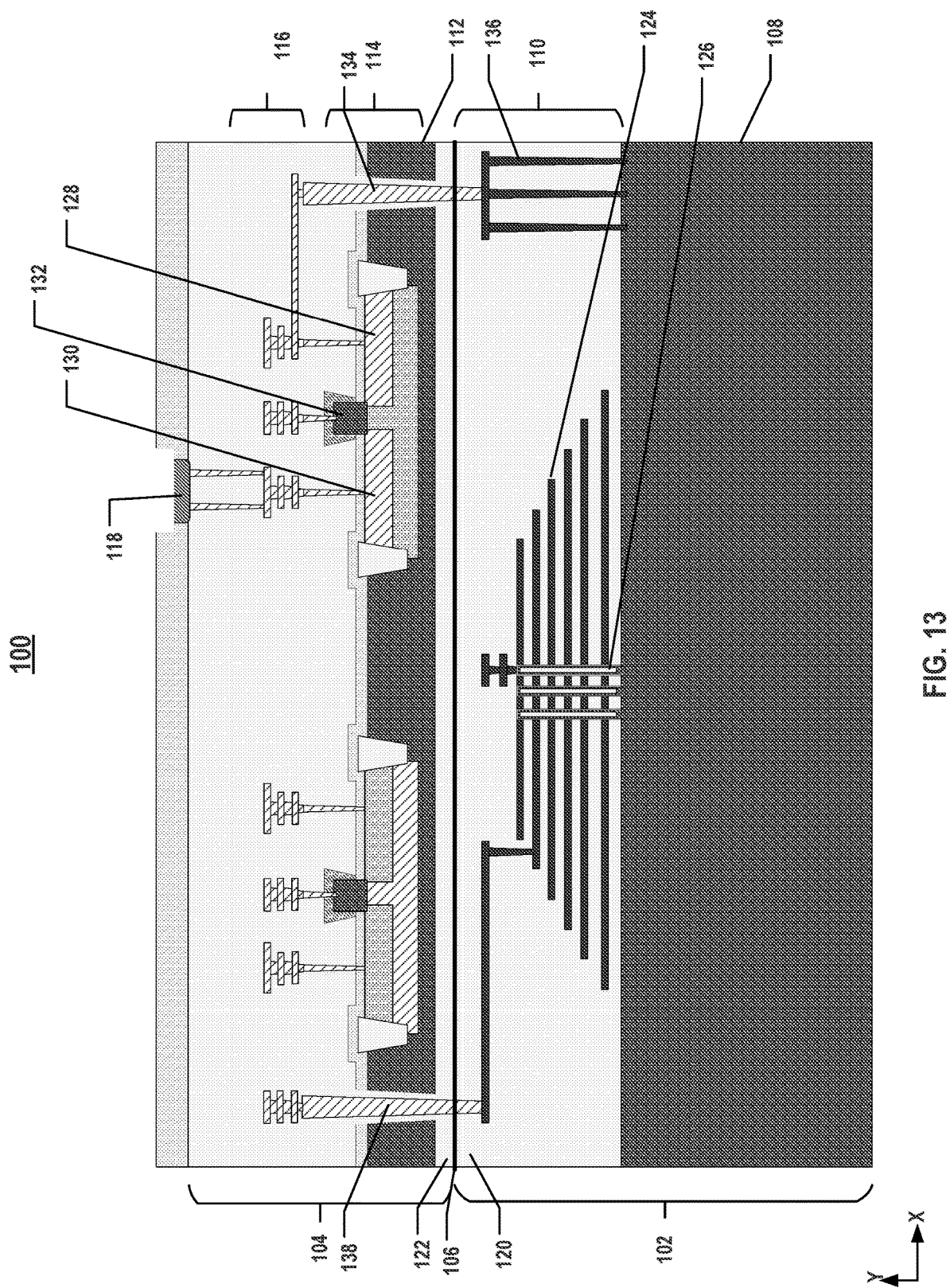
Figure 14:
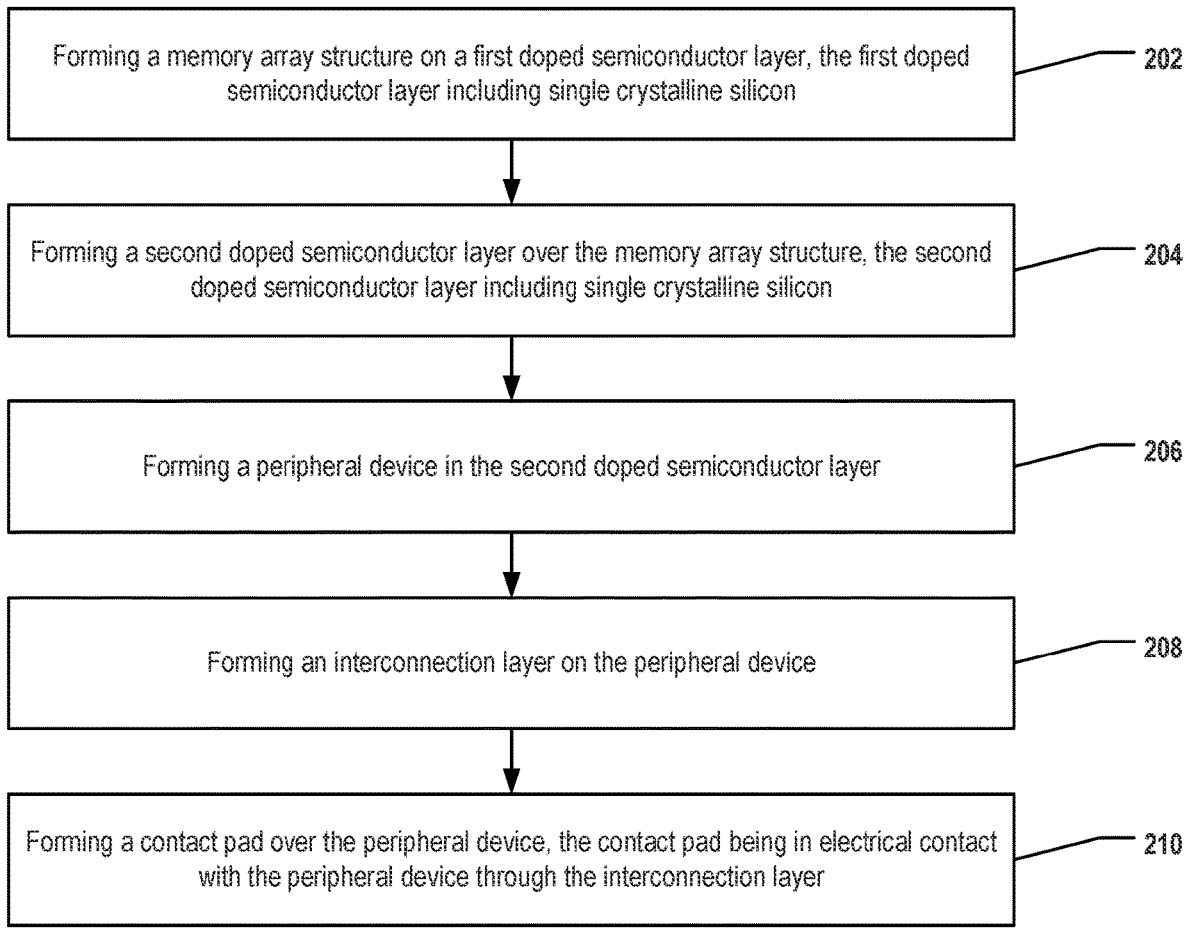
FIG. 14 illustrates a flowchart of an exemplary method for forming a 3D memory device, according to some aspects of the present disclosure.

As shown in FIG. 13 and operation 210 in FIG. 14, contact pad 118 is formed over peripheral device layer 114. Contact pad 118 is in electrical contact with second source/drain terminal 130 through interconnection layer 116. Peripheral device layer 114, including one or more peripheral devices, is disposed between contact pad 118 and memory array structure 110. In other words, 3D memory device 100 is a core under periphery (CUP) structure, and the structure is padded out from the upper side of the peripheral devices. In addition, the active layer of the peripheral devices, e.g., substrate 112 of peripheral device layer 114, is bonded to first semiconductor structure 102 through the transfer bonding methods 300 or 400, and peripheral devices can be electrically connected to memory array structure 110 through TSC structures 134 or 138. Because peripheral device layer 114 is bonded onto memory array structure 110 after finishing the manufacturing process of memory array structure 110, the peripheral devices in peripheral device layer 114 can avoid being treated under a high temperature generally used in the manufacturing process of memory array structure 110. Therefore, the liability of the peripheral devices can be improved, and the conductive material used in the peripheral devices can have more options as well. For example, since the peripheral devices will not be treated in the high temperature, the conductive lines or layers in peripheral device layer 114 or interconnection layer 116 can be formed by Cu to improve the liability and performance of 3D memory device 100.

Figure 19:
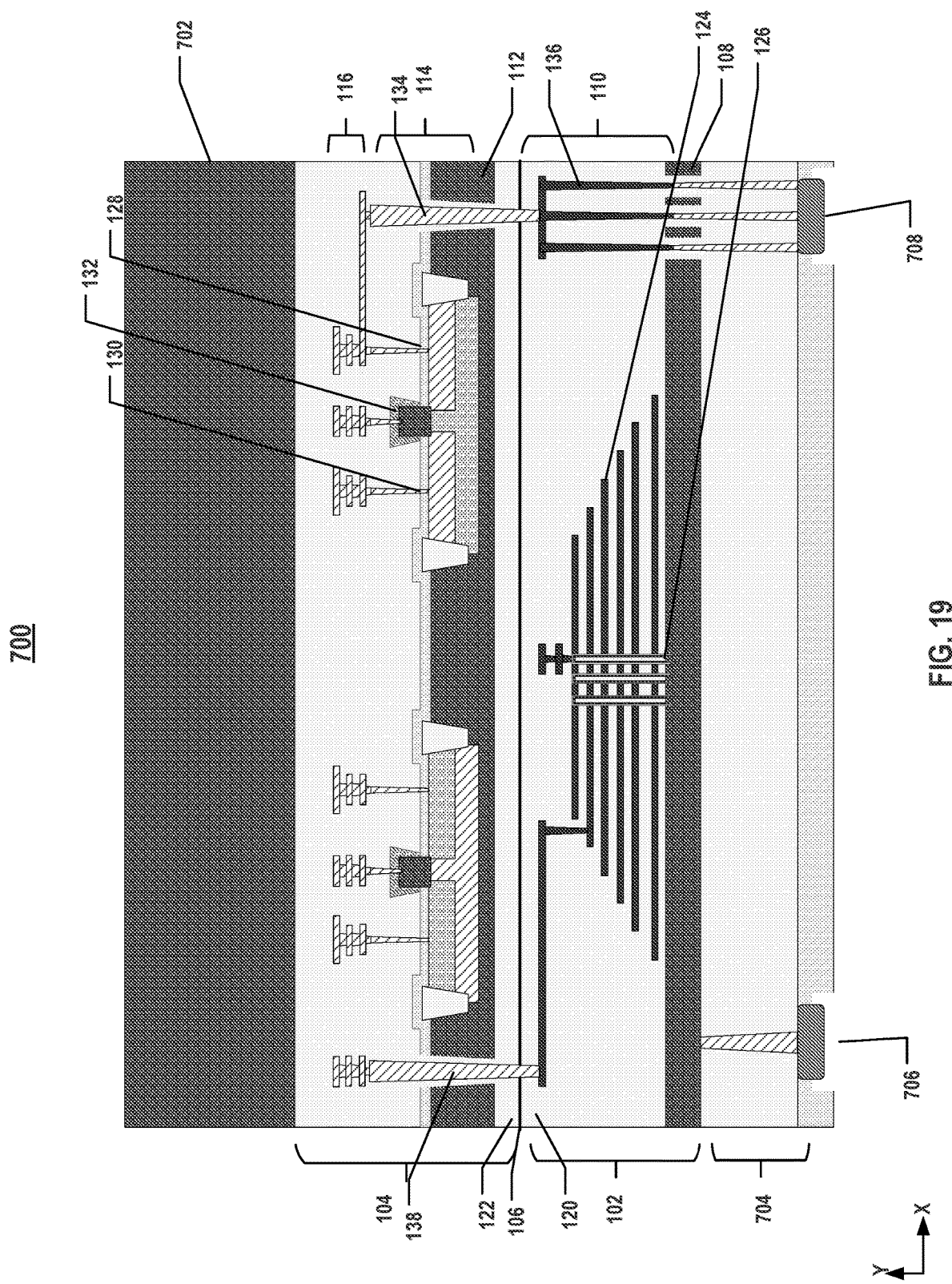
FIG. 19 illustrates a cross-section of another exemplary 3D memory device, according to some aspects of the present disclosure.

FIG. 19 illustrates a cross-section of another exemplary 3D memory device 700, according to some aspects of the present disclosure. The difference between 3D memory device 700 shown in FIG. 19 and 3D memory device 100 shown in FIG. 13 is the padding out structure. As shown in FIG. 19, a contact pad 706 and a contact pad 708 are disposed beneath first semiconductor structure 102. For forming 3D memory device 700 shown in FIG. 19, after operation 208, a handling substrate 702 may be formed on second semiconductor structure 104, and a thinning operation may be performed to remove a portion of substrate 108.

Then, an interconnection layer 704 may be formed over substrate 108. Interconnection layer 704 may include contact pad 706 electrically coupled to substrate 108 through interconnection layer 704. Interconnection layer 704 may further include contact pad 708 electrically coupled to first source/drain terminal 128 through TSC structure 134, interconnection structure 136 and interconnection layer 704.

Figure 17:
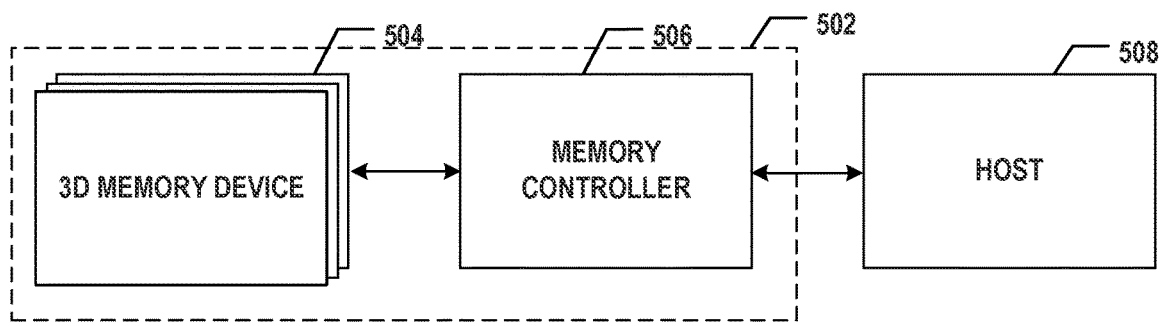
FIG. 17 illustrates a block diagram of an exemplary system having a memory device, according to some aspects of the present disclosure.

FIG. 17 illustrates a block diagram of an exemplary system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 17, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive data to or from memory devices 504.

Memory device 504 can be any memory device disclosed in the present disclosure. As disclosed above in detail, memory device 504, such as a NAND Flash memory device, may have a controlled and predefined discharge current in the discharge operation of discharging the bit lines. Memory controller 506 is coupled to memory device 504 and host 508 and is configured to control memory device 504, according to some implementations. Memory controller 506 can manage the data stored in memory device 504 and communicate with host 508. For example, memory controller 506 may be coupled to memory device 504, such as 3D memory device 100 described above, and memory controller 506 may be configured to control operations of memory array structure 110 through peripheral device layer 114, interconnection layer 116 and contact pad 118. By forming the structure according to the present disclosure, the signals of 3D memory device 100 can be padded out from the upper side of the peripheral devices. In addition, the liability of the peripheral devices can be improved, and the conductive material used in the peripheral devices can have more options as well.

In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of memory device 504, such as read, erase, and program operations. Memory controller 506 can also be configured to manage various functions with respect to the data stored or to be stored in memory device 504 including, but not limited to bad-block management, garbage collection, logical-to-physical address conversion, wear leveling, etc. In some implementations, memory controller 506 is further configured to process error correction codes (ECCs) with respect to the data read from or written to memory device 504. Any other suitable functions may be performed by memory controller 506 as well, for example, formatting memory device 504. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 18A:
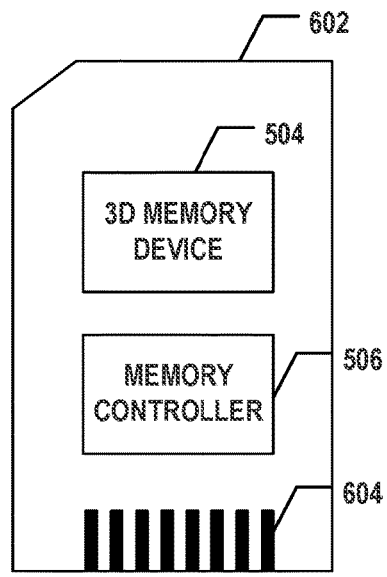
FIG. 18A illustrates a diagram of an exemplary memory card having a memory device, according to some aspects of the present disclosure.
Figure 18B:
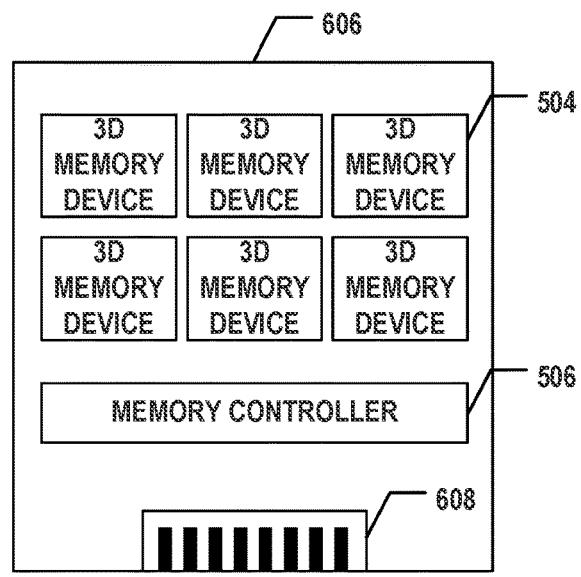
FIG. 18B illustrates a diagram of an exemplary solid-state drive (SSD) having a memory device, according to some aspects of the present disclosure.

Memory controller 506 and one or more memory devices 504 can be integrated into various types of storage devices, for example, be included in the same package, such as a universal Flash storage (UFS) package or an eMMC package. That is, memory system 502 can be implemented and packaged into different types of end electronic products. In one example as shown in FIG. 18A, memory controller 506 and a single memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 602 can further include a memory card connector 604 coupling memory card 602 with a host (e.g., host 508 in FIG. 17). In another example as shown in FIG.

18B, memory controller 506 and multiple memory devices 504 may be integrated into an SSD 606. SSD 606 can further include an SSD connector 608 coupling SSD 606 with a host (e.g., host 508 in FIG. 17). In some implementations, the storage capacity and/or the operation speed of SSD 606 is greater than those of memory card 602.

According to one aspect of the present disclosure, a 3D memory device is disclosed. The 3D memory device includes a first semiconductor structure, and a second semiconductor structure. The first semiconductor structure includes a first substrate, and a memory array structure disposed on the first substrate. The second semiconductor structure is disposed over the first semiconductor structure, and the second semiconductor structure includes a second substrate, and a peripheral device in contact with the second substrate. The second substrate is formed between the peripheral device and the first semiconductor structure.

In some implementations, an interconnection layer is disposed over the second semiconductor structure. The memory array structure is disposed between the interconnection layer and the first substrate. A contact pad of the interconnection layer is electrically coupled to the peripheral device. In some implementations, an interconnection layer is disposed over the first semiconductor structure. The second substrate is disposed between the interconnection layer and the peripheral device. A contact pad of the interconnection layer is electrically coupled to the peripheral device.

In some implementations, the memory array structure further includes a memory stack having a plurality of interleaved conductive layers and dielectric layers, and a channel structure extending through the memory stack. The channel structure includes a memory film and a semiconductor channel, and the semiconductor channel is in contact with the first substrate.

In some implementations, a first through silicon contact structure penetrates through the second substrate, and the first substrate is electrically coupled to the peripheral device through the first through silicon contact structure. In some implementations, the peripheral device further includes a transistor, and the first substrate is electrically coupled to a first source/drain terminal of the transistor through the first through silicon contact structure.

In some implementations, the contact pad is electrically coupled to a second source/drain terminal of the transistor. In some implementations, a second through silicon contact structure penetrates through the second substrate. The memory array structure is electrically coupled to the peripheral device through the second through silicon contact structure.

In some implementations, the first through silicon contact structure, the second through silicon contact structure, and the interconnection layer are formed by copper (Cu). In some implementations, a bonding interface is formed between the first semiconductor structure and the second semiconductor structure. In some implementations, the first substrate includes single crystalline silicon layer. In some implementations, the second substrate includes single crystalline silicon layer.

According to another aspect of the present disclosure, a system is disclosed. The system includes a 3D memory device configured to store data and a memory controller. The 3D memory device includes a first semiconductor structure, and a second semiconductor structure. The first semiconductor structure includes a first substrate, and a memory array structure disposed on the first substrate. The second semiconductor structure is disposed over the first semiconductor structure, and the second semiconductor structure includes a second substrate, and a peripheral device in contact with the second substrate. The second substrate is formed between the peripheral device and the first semiconductor structure. The memory controller is coupled to the 3D memory device and is configured to control operations of the 3D memory device.

According to still another aspect of the present disclosure, a method for forming a 3D memory device is disclosed. A memory array structure is formed over a first substrate. A second substrate is formed over the memory array structure. A peripheral device is formed in contact with the second substrate. An interconnection layer is formed over the peripheral device. The second substrate is disposed between the peripheral device and the memory array structure.

In some implementations, a contact pad is embedded within the interconnection layer. The contact pad is in contact with the peripheral device. In some implementations, a contact pad is formed over the first substrate. The first substrate is disposed between the contact pad and the memory array structure.

In some implementations, a dielectric stack including a plurality of dielectric layers and a plurality of sacrificial layers is formed interleaved on the first substrate, a channel structure is formed extending vertically through the dielectric stack in contact with the first substrate, and the plurality of sacrificial layers are replaced with a plurality of conductive layers.

In some implementations, a stack structure including a plurality of word lines is formed on the first substrate, and a channel structure is formed extending vertically through the stack structure in contact with the first substrate.

In some implementations, a third substrate including a dielectric layer is provided, the third substrate is bonded to the memory array structure in a face-to-face manner through the dielectric layer, a heterogeneous interface is formed in the third substrate, and a portion of the third substrate is removed along the heterogeneous interface to form the second substrate. In some implementations, the heterogeneous interface is formed in the third substrate including implanting a dopant into the substrate. In some implementations, the dopant includes hydrogen.

In some implementations, a composite substrate is bonded on the memory array structure, and a portion of the composite substrate is removed to form the second substrate. In some implementations, the composite substrate includes a silicon-on-insulator (SOI) substrate including a single crystalline silicon layer, an insulation layer, and a single crystalline silicon substrate. In some implementations, the single crystalline silicon substrate and the insulation layer above the single crystalline silicon layer are removed from the composite substrate to form the second substrate.

In some implementations, a transistor is formed in the second substrate, the transistor including a gate structure, a first source/drain terminal, and a second source/drain terminal. In some implementations, a first through silicon contact structure is formed penetrating the second substrate. The peripheral device is electrically coupled to the first substrate through the first through silicon contact structure. In some implementations, the first source/drain terminal and the first substrate are electrically connected through the first through silicon contact structure.

In some implementations, a second through silicon contact structure is formed penetrating the second substrate. The peripheral device is electrically coupled to a word line of the memory array structure through the second through silicon contact structure. In some implementations, the contact pad is formed over the transistor and is electrically connected the second source/drain terminal.

According to yet another aspect of the present disclosure, a method for forming a 3D memory device is disclosed. A first dielectric layer is formed over a first substrate. A memory array structure is formed in the first dielectric layer. A second substrate is bonded to the first dielectric layer. The second substrate includes a second dielectric layer, and the second dielectric layer is bonded to the first dielectric layer. A heterogeneous interface is formed in the second substrate. A portion of the second substrate is removed along the heterogeneous interface to form a third substrate over the memory array structure. A peripheral device is formed in the third substrate. An interconnection layer over the peripheral device. The third substrate is disposed between the peripheral device and the memory array structure.

In some implementations, a dielectric stack including a plurality of dielectric layers and a plurality of sacrificial layers is formed interleaved on the first substrate, a channel structure is formed extending vertically through the dielectric stack in contact with the first substrate, and the plurality of sacrificial layers are replaced with a plurality of conductive layers.

In some implementations, a stack structure including a plurality of word lines is formed on the first substrate, and a channel structure is formed extending vertically through the stack structure in contact with the first substrate.

In some implementations, the heterogeneous interface is formed in the second substrate including implanting a dopant into the second substrate. In some implementations, the dopant includes hydrogen.

In some implementations, a transistor is formed in the third substrate. The transistor includes a gate structure, a first source/drain terminal, and a second source/drain terminal. In some implementations, a first through silicon contact structure is formed penetrating the third substrate. The peripheral device is electrically coupled to the first substrate through the first through silicon contact structure. In some implementations, the first source/drain terminal and the first substrate are electrically connected through the first through silicon contact structure.

In some implementations, a second through silicon contact structure is formed penetrating the third substrate. The peripheral device is electrically coupled to a word line of the memory array structure through the second through silicon contact structure. In some implementations, a contact pad is embedded within the interconnection layer. The contact pad is in contact with the peripheral device. In some implementations, the contact pad is formed over the transistor and electrically connecting the second source/drain terminal.

According to yet another aspect of the present disclosure, a method for forming a 3D memory device is disclosed. A first dielectric layer is formed over a first substrate. A memory array structure is formed in the first dielectric layer. A composite substrate is bonded to the first dielectric layer. The composite substrate includes a second dielectric layer, and the second dielectric layer is bonded to the first dielectric layer. A portion of the composite substrate is removed to form a second substrate over the memory array structure. A peripheral device is formed in the second substrate. An interconnection layer is formed over the peripheral device. The second substrate is disposed between the peripheral device and the memory array structure.

In some implementations, a dielectric stack including a plurality of dielectric layers and a plurality of sacrificial layers is formed interleaved on the first substrate, a channel structure is formed extending vertically through the dielectric stack in contact with the first substrate, and the plurality of sacrificial layers are replaced with a plurality of conductive layers.

In some implementations, a stack structure including a plurality of word lines is formed on the first substrate, and a channel structure is formed extending vertically through the stack structure in contact with the first substrate.

In some implementations, the composite substrate further includes a silicon-on-insulator (SOI) substrate including a single crystalline silicon layer, an insulation layer, and a single crystalline silicon substrate. In some implementations, the single crystalline silicon substrate and the insulation layer above the single crystalline silicon layer are removed from the composite substrate to form the second substrate.

In some implementations, a transistor is formed in the second substrate. The transistor includes a gate structure, a first source/drain terminal, and a second source/drain terminal. In some implementations, a first through silicon contact structure is formed penetrating the second substrate. The peripheral device is electrically coupled to the first substrate through the first through silicon contact structure. In some implementations, the first source/drain terminal and the first substrate are electrically connected through the first through silicon contact structure.

In some implementations, a second through silicon contact structure is formed penetrating the second substrate. The peripheral device is electrically coupled to a word line of the memory array structure through second through silicon contact structure. In some implementations, a contact pad is embedded within the interconnection layer. The contact pad is in contact with the peripheral device. In some implementations, the contact pad is formed over the transistor and electrically connecting the second source/drain terminal.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a first semiconductor structure comprising a first semiconductor layer, and a memory array structure disposed on the first semiconductor layer; and
   a second semiconductor structure disposed over the first semiconductor structure, the second semiconductor structure comprising a second semiconductor layer, and a peripheral device in contact with the second semiconductor layer,
   wherein the second semiconductor layer is formed between the peripheral device and the first semiconductor structure;
   wherein a contact pad for transferring electrical signals between the 3D memory device and external circuits is formed on the second semiconductor structure opposite to the second semiconductor layer; and
   wherein a first through silicon contact structure penetrates through the second semiconductor layer to the first semiconductor structure, and the first semiconductor layer is electrically coupled to the peripheral device through the first through silicon contact structure.

2. The 3D memory device of claim 1, further comprising:
an interconnection layer disposed over the second semiconductor structure,
wherein the memory array structure is disposed between the interconnection layer and the first semiconductor layer; and
a contact pad of the interconnection layer is electrically coupled to the peripheral device.

3. The 3D memory device of claim 1, further comprising:
an interconnection layer disposed over the first semiconductor structure,
wherein the second semiconductor layer is disposed between the interconnection layer and the peripheral device; and
a contact pad of the interconnection layer is electrically coupled to the peripheral device.

4. The 3D memory device of claim 1, wherein the memory array structure further comprises:
a memory stack having a plurality of interleaved conductive layers and dielectric layers; and
a channel structure extending through the memory stack, the channel structure comprising a memory film and a semiconductor channel,
wherein the semiconductor channel is in contact with the first semiconductor layer.

5. The 3D memory device of claim 2, wherein the peripheral device further comprises a transistor, and the first semiconductor layer is electrically coupled to a first source/drain terminal of the transistor through the first through silicon contact structure.

6. The 3D memory device of claim 5, wherein the contact pad is electrically coupled to a second source/drain terminal of the transistor.

7. The 3D memory device of claim 6, further comprising a second through silicon contact structure penetrating through the second semiconductor layer, and the memory array structure is electrically coupled to the peripheral device through the second through silicon contact structure.

8. The 3D memory device of claim 7, wherein the first through silicon contact structure, the second through silicon contact structure, and the interconnection layer are formed by copper (Cu).

9. The 3D memory device of claim 1, further comprising a bonding interface between the first semiconductor structure and the second semiconductor structure.

10. The 3D memory device of claim 1, wherein the first semiconductor layer comprises single crystalline silicon layer.

11. The 3D memory device of claim 10, wherein the second semiconductor layer comprises single crystalline silicon layer.

12. A method for forming a three-dimensional (3D) memory device, comprising:
forming a memory array structure over a first semiconductor layer;
forming a second semiconductor layer over the memory array structure;
after forming the second semiconductor layer over the memory array structure, forming a peripheral device in contact with the second semiconductor layer; and
forming an interconnection layer over the peripheral device,
wherein the second semiconductor layer is disposed between the peripheral device and the memory array structure.

13. The method of claim 12, further comprising:
forming a contact pad embedded within the interconnection layer, wherein the contact pad is in contact with the peripheral device.

14. The method of claim 12, further comprising:
forming a contact pad over the first semiconductor layer, wherein the first semiconductor layer is disposed between the contact pad and the memory array structure.

15. The method of claim 12, wherein forming the second semiconductor layer over the memory array structure, further comprises:
providing a third semiconductor layer comprising a dielectric layer;
bonding the third semiconductor layer to the memory array structure in a face-to-face manner through the dielectric layer;
forming a heterogeneous interface in the third semiconductor layer; and
removing a portion of the third semiconductor layer along the heterogeneous interface to form the second semiconductor layer.

16. The method of claim 12, wherein forming the second semiconductor layer over the memory array structure, further comprises:
bonding a composite semiconductor layer on the memory array structure; and
removing a portion of the composite semiconductor layer to form the second semiconductor layer.

17. A method for forming a three-dimensional (3D) memory device, comprising:
forming a first dielectric layer over a first semiconductor layer;
forming a memory array structure in the first dielectric layer;
bonding a second semiconductor layer to the first dielectric layer, wherein the second semiconductor layer comprises a second dielectric layer, and the second dielectric layer is bonded to the first dielectric layer;
forming a heterogeneous interface in the second semiconductor layer;
removing a portion of the second semiconductor layer along the heterogeneous interface to form a third semiconductor layer over the memory array structure;
forming a peripheral device in the third semiconductor layer; and
forming an interconnection layer over the peripheral device,
wherein the third semiconductor layer is disposed between the peripheral device and the memory array structure.

18. The method of claim 17, wherein forming the heterogeneous interface in the second semiconductor layer comprises implanting a dopant into the second semiconductor layer.

19. The method of claim 17, further comprising:
forming a first through silicon contact structure penetrating the third semiconductor layer,
wherein the peripheral device is electrically coupled to the first semiconductor layer through the first through silicon contact structure.

20. The 3D memory device of claim 1, wherein the first through silicon contact structure extends in the second semiconductor structure to the first semiconductor structure.

* * * * *